(12) United States Patent
Chang et al.

(10) Patent No.: US 7,880,701 B2
(45) Date of Patent: Feb. 1, 2011

(54) DISPLAY DEVICE AND MANUFACTURING METHOD THEREOF

(75) Inventors: Young-Jin Chang, Yongin-si (KR); Seung-Hwan Shim, Seongnam-si (KR); Hoon-Kee Min, Seoul (KR); Kwan-Wook Jung, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 889 days.

(21) Appl. No.: 11/734,630

(22) Filed: Apr. 12, 2007

(65) Prior Publication Data

US 2007/0242176 A1    Oct. 18, 2007

(30) Foreign Application Priority Data

Apr. 12, 2006    (KR) ............... 10-2006-0033134

(51) Int. Cl.
    *G09G 3/36*    (2006.01)
(52) U.S. Cl. ............... 345/87; 345/92; 345/100
(58) Field of Classification Search ............ 345/82, 345/84, 87, 92, 100, 204–206, 76, 211; 349/45, 349/138, 42, 39; 257/59, 72, 75, 410, 411, 257/194, 103, 66; 438/48, 612, 149, 166, 438/159, 485; 313/504
See application file for complete search history.

(56) References Cited

U.S. PATENT DOCUMENTS

| | | | | |
|---|---|---|---|---|
| 5,180,690 A | * | 1/1993 | Czubatyj et al. | 438/485 |
| 5,969,377 A | * | 10/1999 | Seo | 257/72 |
| 6,476,788 B1 | * | 11/2002 | Akimoto | 345/92 |
| 6,653,179 B1 | * | 11/2003 | Minegishi et al. | 438/166 |
| 6,833,561 B2 | * | 12/2004 | Joo et al. | 257/75 |
| 7,544,550 B2 | * | 6/2009 | Kakkad et al. | 438/166 |
| 7,592,986 B2 | * | 9/2009 | You et al. | 345/82 |
| 2003/0102478 A1 | * | 6/2003 | Joo et al. | 257/72 |
| 2003/0179166 A1 | * | 9/2003 | Li | 345/84 |
| 2005/0074914 A1 | * | 4/2005 | Chang et al. | 438/48 |
| 2005/0162363 A1 | * | 7/2005 | Kim | 345/92 |
| 2006/0003502 A1 | * | 1/2006 | Kakkad et al. | 438/149 |
| 2006/0145968 A1 | * | 7/2006 | You et al. | 345/76 |
| 2006/0202204 A1 | * | 9/2006 | Choi et al. | 257/59 |
| 2006/0267911 A1 | * | 11/2006 | Jang | 345/100 |
| 2007/0020910 A1 | * | 1/2007 | Park et al. | 438/612 |
| 2009/0303220 A1 | * | 12/2009 | You et al. | 345/211 |

* cited by examiner

*Primary Examiner*—Prabodh M Dharia
(74) *Attorney, Agent, or Firm*—F. Chau & Associates, LLC

(57) ABSTRACT

A display device includes a substrate, first and second signal lines formed on the substrate, a first thin film transistor connected to the first and second signal lines, a gate driver and a data driver connected to the first signal line and the second signal line, respectively, and a second thin film transistor formed in at least one of the gate driver and the data driver The first thin film transistor and the second thin film transistor include a first semiconductor and a second semiconductor, respectively, and the first semiconductor and the second semiconductor are formed at the different layers from each other.

18 Claims, 19 Drawing Sheets

DISPLAY DEVICE AND MANUFACTURING METHOD THEREOF

CROSS-REFERENCE TO RELATED APPLICATION

This application claims priority to and the benefit of Korean Patent Application No. 10-2006-0033134 filed in the Korean Intellectual Property Office on Apr. 12, 2006, the entire contents of which are herein incorporated by reference.

BACKGROUND OF THE INVENTION (a) Field of the Invention

The present disclosure is directed to a display device and a manufacturing method thereof.

(b) Description of the Related Art

A flat panel display such as a liquid crystal display and an organic light emitting device includes several pairs of field generating electrodes and electro-optical active layers interposed therebetween. The liquid crystal display includes a liquid crystal layer as an electro-optical active layer, and the organic light emitting device includes an organic emission layer as the electro-optical active layer.

One electrode of a pair of field generating electrodes, i.e., a pixel electrode, is commonly connected to a switching element for transmitting electrical signals to the pixel electrode, and the electro-optical active layer converts the electrical signals to optical signals to display an image. In this case, the switching element is controlled by a gate line for transmitting gate signals and a data line for transmitting signals to be applied to the pixel electrode.

Additionally, this display device includes a gate driver applying gate-on voltages to the gate line and a data driver applying image signals to the data line. The gate driver and the data driver have a plurality of switching elements, which control signals transmitted from a signal controller.

An active matrix type of organic light emitting device includes a plurality of pixels, each including a switching transistor, a driving transistor, and a storage capacitor as well as an anode, a cathode, and a light emission layer, and the driving transistor receives a data voltage from the switching transistor and drives a current having a magnitude determined depending on the data voltage. The current from the driving transistor enters the light emission layer to cause light emission having intensity depending on the current.

In the active matrix type of organic light emitting device, characteristics of the switching thin film transistor and those of the driving thin film transistor may be different from each other. In detail, the switching thin film transistor may have a good on/off characteristic, and the driving thin film transistor may have a high mobility and stability for supplying sufficient current for driving the organic light emitting device.

SUMMARY OF THE INVENTION

A display device according to an embodiment of the present invention includes an image display unit including a first thin film transistor, and a driving unit formed outside of the image display unit and including a second thin film transistor. The first thin film transistor and the second thin film transistor include a first semiconductor and a second semiconductor respectively, and the first semiconductor and the second semiconductor are formed in different layers from each other.

The first semiconductor may include an amorphous semiconductor and the second semiconductor may include a polycrystalline semiconductor.

The driving unit may include a gate driver connected to a first signal line, and a data driver connected to a second signal line intersecting the first signal line. The first signal line and the second signal line may be connected to the first thin film transistor.

The first thin film transistor may include a first input electrode connected to the first signal line, a gate insulating layer located between the first input electrode and the first semiconductor, a first input electrode formed on the first semiconductor and connected to the second signal line, and a first output electrode facing the first input electrode.

The second thin film transistor may include a second control electrode formed on the second semiconductor, and a second input electrode and a second output electrode located on the second control electrode and connected to the second semiconductor, respectively.

The display device may further include a plurality of ohmic contacts located between the first semiconductor and the first input electrode, between the first semiconductor and the first output electrode, between the second semiconductor and the second input electrode, and between the second semiconductor and the second output electrodes respectively.

The ohmic contacts have substantially the same planar shapes as the first input electrode, the first output electrode, the second input electrode, and the second output electrode, respectively.

A display device according to another embodiment of the present invention includes a substrate, first and second signal lines formed on the substrate; a switching thin film transistor connected to the first and second signal lines; a driving thin film transistor connected to the switching thin film transistor; a first electrode connected to the driving thin film transistor, a second electrode facing the first electrode, and a light emitting member formed between the first electrode and the second electrode. The switching thin film transistor may include a first control electrode connected to the first signal line, a first semiconductor formed on the first control electrode; a first input electrode formed on the first semiconductor and connected to the second signal line; and a first output electrode facing the first input electrode, and the driving thin film transistor may include a second semiconductor formed on the substrate, a second control electrode formed on the second semiconductor and connected to the first output electrode, a second input electrode connected to the second semiconductor on the second control electrode; and a second output electrode facing the first input electrode and connected to the first electrode.

The first semiconductor may include an amorphous semiconductor and the second semiconductor may include a polycrystalline semiconductor.

The display device may further include a plurality of ohmic contacts located between the first semiconductor and the first input electrode, between the first semiconductor and the first output electrode, between the second semiconductor and the second input electrode, and between the second semiconductor and the second output electrode, respectively.

The ohmic contacts may have substantially the same planar shapes as the first input electrode, the first output electrode, the second input electrode, and the second output electrode, respectively.

A manufacturing method of the display device including a plurality of first thin film transistors and a plurality of second thin film transistors according to an embodiment of the present invention includes forming a polycrystalline semiconductor on a substrate; forming a first insulating layer on the polycrystalline semiconductor; forming a gate line including a first control electrode of the first thin film transistor and a second control electrode located on the polycrystalline semiconductor by depositing a conductive layer on the first insulating layer and patterning the conductive layer by photolithography and etching; forming a second insulating layer on the gate line and the second control electrode; forming an amorphous semiconductor located over the first control electrode on the second insulating layer; forming first and second contact holes in the first and second insulating layers; and forming a data line including a first input electrode, a first output electrode facing the first input electrode, a second input electrode contacting to the polycrystalline semiconductor through the first contact hole, and a second output electrode facing the second input electrode by depositing a conductive layer on the second insulating layer and patterning the conductive layer by photolithography and etching.

The method may further include forming an ohmic contact layer after forming the first and second contact holes; and etching the ohmic contact layer using the data line, the first output electrode, the second input electrode, and the second output electrode as a mask after forming the data line, the first output electrode, the second input electrode, and the second output electrode.

The forming of the polycrystalline semiconductor may be performed by solid phase crystallization.

The first thin film transistors may be located in a display area of the display device and the second thin film transistors may be located in a driving area of the display device.

The method may further include forming a pixel electrode connected to the second output electrode after forming the data line, the first output electrode, the second input electrode, and the second output electrode.

The method may further include forming a third insulating layer having an opening on the pixel electrode, forming a light emitting member in the opening, and forming a common electrode on the light emitting member.

A connecting member connecting the first output electrode and the second input electrode may be formed in the step of forming the pixel electrode.

DETAILED DESCRIPTION OF THE EXEMPLARY EMBODIMENTS

Exemplary embodiments of the present invention will hereinafter be described in detail with reference to the accompanying drawings.

First, a display device according to an embodiment of the present invention will be described in detail with reference to FIG. 1 and 2.

Figure 1:
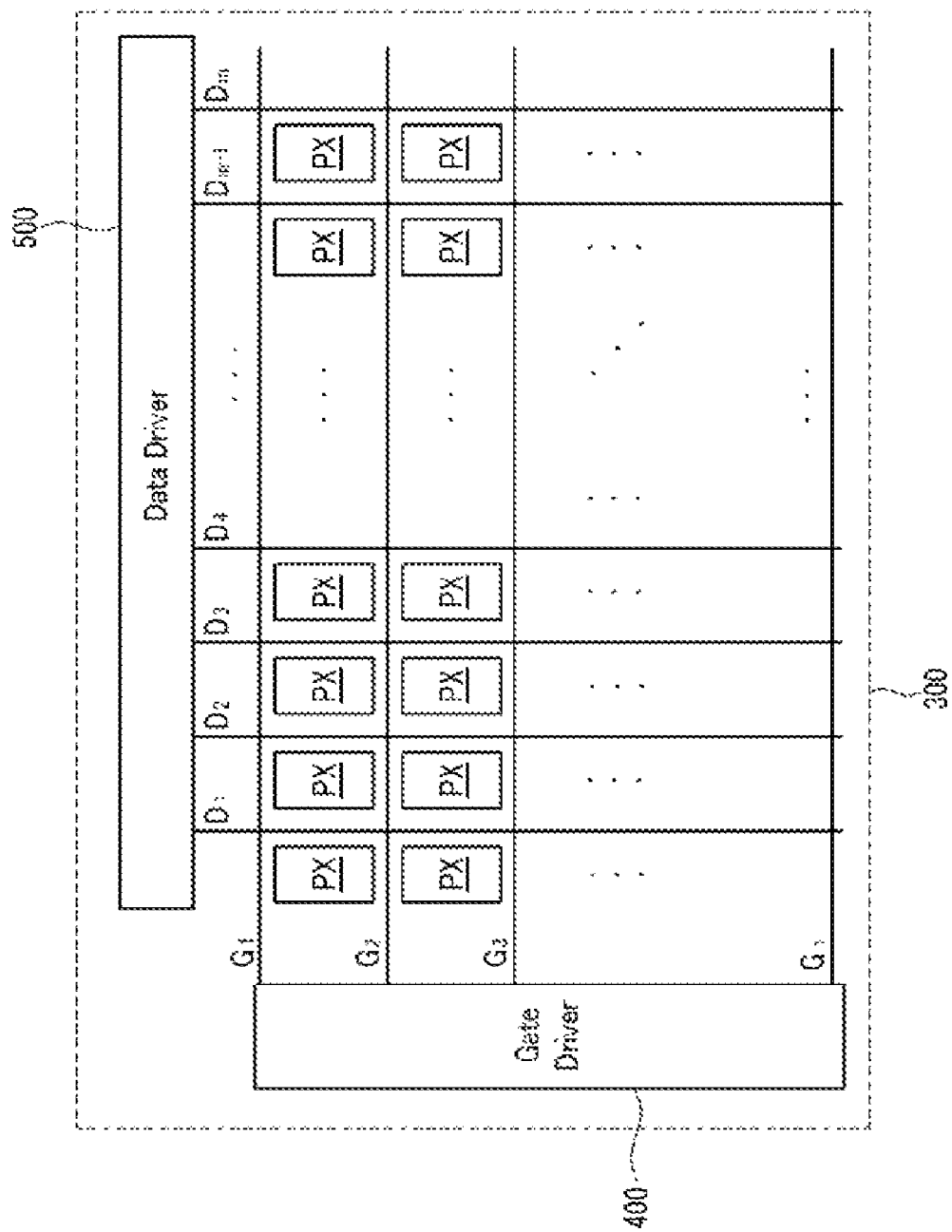
FIG. 1 is a schematic diagram of a liquid crystal display according to an embodiment of the present invention.
Figure 2:
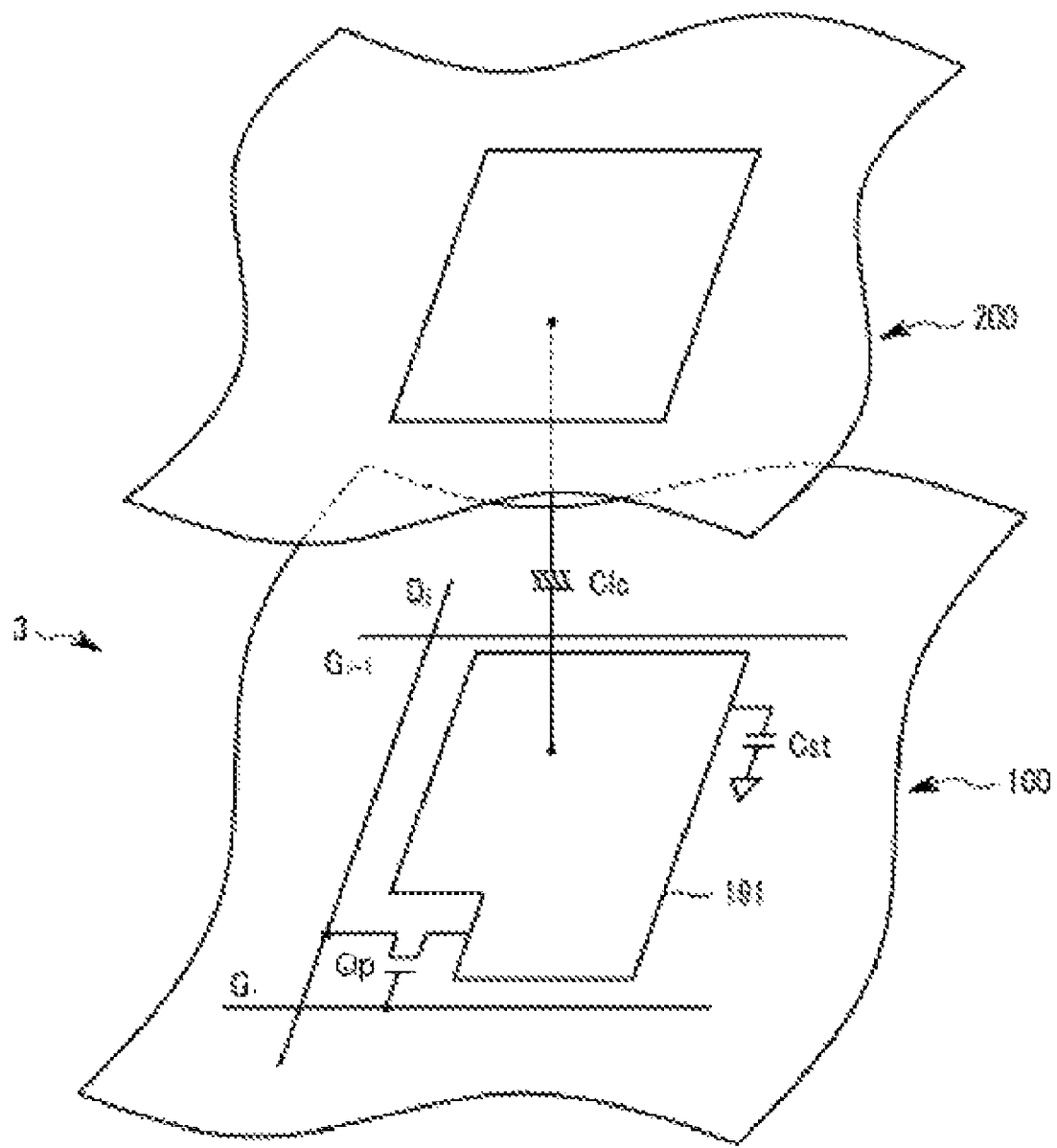
FIG. 2 an equivalent circuit diagram of a pixel in a liquid crystal display according to an embodiment of the present invention.

FIG. 1 is a schematic diagram of a liquid crystal display according to an embodiment of the present invention, and FIG. 2 an equivalent circuit diagram of a pixel in a liquid crystal display according to an embodiment of the present invention.

Referring to FIG. 1 and FIG. 2, a liquid crystal display according to an embodiment of the present invention includes a liquid crystal panel assembly 300.

The liquid crystal panel assembly 300 includes a plurality of gate lines G1-Gn and a plurality of data lines D1-Dm intersecting each other, and a plurality of pixels PX connected to the signal lines G1-Gn and D1-Dm and arranged substantially in a matrix.

The liquid crystal panel assembly 300 includes a display area including a plurality of pixels PX and a driving area located outside of the display area and having a gate driver 400 and a data driver 500.

As shown in FIG. 2, the display area includes a lower panel 100 and an upper panel 200 facing each other, and a liquid crystal layer 3 disposed between the two panels. Each pixel PX includes a thin film transistor Qp connected to signal lines as a switching element, and a liquid crystal capacitor Clc and storage capacitor Cst connected to the thin film transistor. The storage capacitor Cst may be omitted.

The thin film transistor Qp is provided on the lower panel 100 and has a control terminal, an input terminal, and an output terminal. The control terminal of the thin film transistor Qp is connected to the gate line Gi, the input terminal of the thin film transistor Qp is connected to the data line Dj, and the output terminal of the thin film transistor Qp is connected to the liquid crystal capacitor Clc and the storage capacitor Cst.

The driving area includes the gate driver 400 and the data driver 500 integrated onto the liquid crystal panel assembly 300.

The gate driver 400 is connected to the gate lines G1 to Gn of the liquid crystal panel assembly 300, and applies the gate signals composed of gate-on voltages Von and gate-off voltages Voff from the outside to the gate lines G1 to Gn.

The data driver 500 is connected to the data lines D1 to Dm of the liquid crystal panel assembly 300 and applies data signals, which are selected from gray voltages supplied from a gray voltage generator (not shown), to the data lines D1 to Dm as the data signals. The data driver 500 is composed of a plurality of integrated circuits.

The data driver 500 includes a plurality of data driving ICs. The data lines are connected to the data driving ICs through transmission gates (not shown). The transmission gates may be turned on/off in response to the switching control signals, and the data voltage is applied to the pixels through the turned-on transmission gates.

The gate driver 400 and the data driver 500 include a plurality of thin film transistors Qb (not shown in FIG. 2) for controlling signals.

A structure of the thin film transistor Qp formed on the display area and a structure of the thin film transistor Qp formed on the driving area of a liquid crystal display according to an embodiment of the present invention will be described in detail with reference to FIG. 3.

Figure 3:
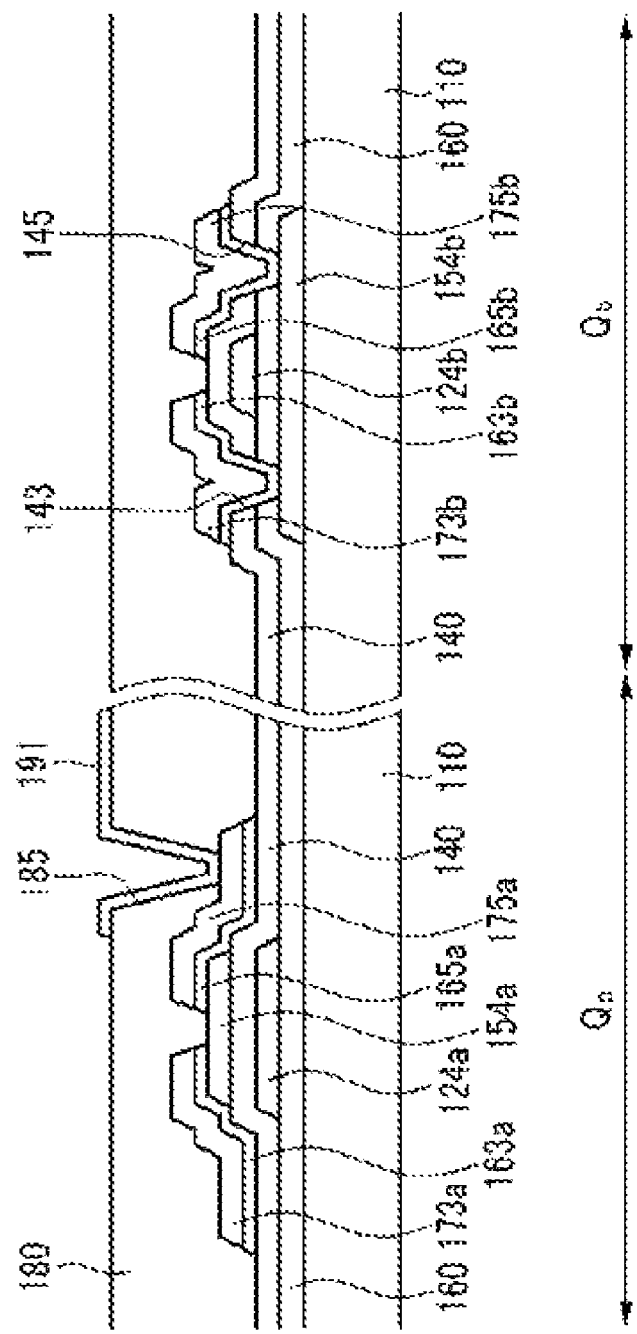
FIG. 3 is a sectional view schematically illustrating a structure of thin film transistors formed on a display area and a structure of thin film transistors formed on a driving area of a liquid crystal display according to an embodiment of the present invention.

FIG. 3 is a sectional view schematically illustrating a structure of thin film transistors formed on a display area and a structure of thin film transistors formed on a driving area of a liquid crystal display according to an embodiment of the present invention.

Hereinafter, in order to classify the thin film transistors formed on both the display area and the driving area, the term "display" will be used for the thin film transistor formed on the display area and the term "circuit" will be used for the thin film transistor formed on the driving area.

A buffer layer (not shown) made of silicon nitride or silicon oxide is formed on an insulating substrate 110 made of transparent glass, silicone, or plastic. A circuit semiconductor 154b made of microcrystalline silicon or polycrystalline silicon is formed on the buffer layer.

A lower gate insulating layer 160 made of silicon nitride or silicon oxide is formed on the circuit semiconductor 154b and substrate 110. The lower gate insulating layer 160 disposed on the circuit semiconductor 154b is used as a circuit gate insulating layer.

A display control electrode 124a and a circuit control electrode 124b are formed on the gate insulating layer 160, respectively. The display control electrode 124a extends from a gate line (not shown).

The display control electrode 124a and the circuit control electrode 124b may be made of an Al-containing metal such as Al or an Al, Ag-containing metal such as Ag or an Ag alloy, a Cu-containing metal such as Cu or a Cu alloy, a Mo-containing metal such as such as Mo or a Mo alloy, Cr, Ta, Ti, etc. However, they may have a multi-layered structure including two conductive layers (not shown) having different physical properties from each other.

The lateral sides of the display control electrode 124a and the circuit control electrode 124b are inclined relative to the surface of the substrate 110, and the inclination angle thereof may be in a range of about 30 to 80 degrees.

An upper gate insulating layer 140 made of silicon nitride (SiNx) or silicon oxide (SiOx) is formed on the display control electrode 124a and the circuit control electrode 124b. The upper gate insulating layer 140 disposed on the display control electrode 124a is used as a display gate insulating layer.

The upper gate insulating layer 140 and the lower gate insulating layer 160 include a plurality of contact holes 143 and 145 exposing the circuit semiconductor 154b.

A display semiconductor 154a made of hydrogenated amorphous silicon is formed on the upper gate insulating layer 140. The display semiconductor 154a overlaps the display control electrode 124a.

A display input electrode 173a extends from the data lines (not shown), and a display output electrode 175a separated from the display input electrode 173a are located opposite each other with respect to the display semiconductor 154a and on the display semiconductor 154a and the upper gate insulating layer 140. A circuit input electrode 173b and a circuit output electrode 175b are located opposite each other with respect to the circuit control electrode 124b on the upper gate insulating layer 140 located on the circuit control electrode 124b.

Ohmic contacts 163a, 165a, 163b and 165b are formed under the display input electrode 173a, the display output electrode 175a, the circuit input electrode 173b, and the circuit output electrode 175b, respectively. The ohmic contacts 163a, 165a, 163b, and 165b have substantially the same planar shape as the display input electrode 173a, the display output electrode 175a, the circuit input electrode 173b, and the circuit output electrode 175b respectively. The ohmic contacts 163a, 165a, 163b, and 165b may be made of n+ hydrogenated amorphous silicon heavily doped with an n-type impurity such as phosphorous.

The display input electrode 173a, the display output electrode 175a, the circuit input electrode 173b, and the circuit output electrode 175b have inclined edge profiles, and the inclination angles thereof are in a range of about 30 to 80 degrees.

A passivation layer 180 is formed on the display input electrode 173a, the display output electrode 175a, the circuit input electrode 173b, and the circuit output electrode 175b.

The passivation layer 180 has a plurality of contact holes 185 exposing a portion of the display output electrode 175a. A pixel electrode 191 is formed on the passivation layer 180.

As described above, the display semiconductor 154a is made of a hydrogenated amorphous semiconductor and the circuit semiconductor 154b is made of a microcrystalline or polycrystalline semiconductor. That is, a channel of the thin film transistor Qp disposed in the display area is formed in the hydrogenated amorphous semiconductor, while a channel of the thin film transistor Qb disposed in the driving area is formed in the crystalline semiconductor.

As described above, the thin film transistor Qp disposed in the display area and the thin film transistor Qb disposed in the driving area of the display device according to this embodiment have channels made of different materials to each other such that the desired characteristics for both thin film transistors Qp and Qb may be satisfied simultaneously.

The display device according to this embodiment includes the thin film transistor Qb of the driving area having the channel formed in the micro-crystalline or polycrystalline semiconductor to enhance carrier mobility and stability. Also, the display device includes the thin film transistor Qb of the driving area that protects the semiconductor from degradation due to gate bias and stress by heat such that a threshold voltage may be maintained uniformly to prevent an image sticking phenomenon and lifetime reduction of the display device. Accordingly, the gate driver and the data driver may be integrated onto the substrate together to reduce manufacturing costs of a liquid crystal display.

In addition, the display device according to this embodiment includes the thin film transistor Qp of the display area having a channel formed in the amorphous semiconductor to increase an $I_{on}/I_{off}$ ratio and decrease leakage current. Accordingly, the thin film transistor Qp of the display area of the display device may prevent reduction of the data voltages and generation of cross-talk.

Although the display device including one thin film transistor Qp of the display area and one thin film transistor Qb of the driving area is described in the above embodiment of the present invention, the display device may include at least one additional thin film transistors Qp and Qb.

Now, a manufacturing method of thin film transistors of the display device shown in FIG. 2 will be described in detail with reference to FIG. 4 to FIG. 9.

FIG. 4 to FIG. 9 are sectional views of the display device shown in FIG. 3 in intermediate steps of a manufacturing method thereof according to an embodiment of the present invention.

Firstly, the buffer layer (not shown) and the amorphous silicon layer are sequentially deposited onto the substrate 110, and the amorphous silicon layer is crystallized. Here, the crystallization may be performed by solid phase crystallization (SPC), excimer laser annealing (ELA), metal induced lateral crystallization (MILC), etc.

Figure 4:
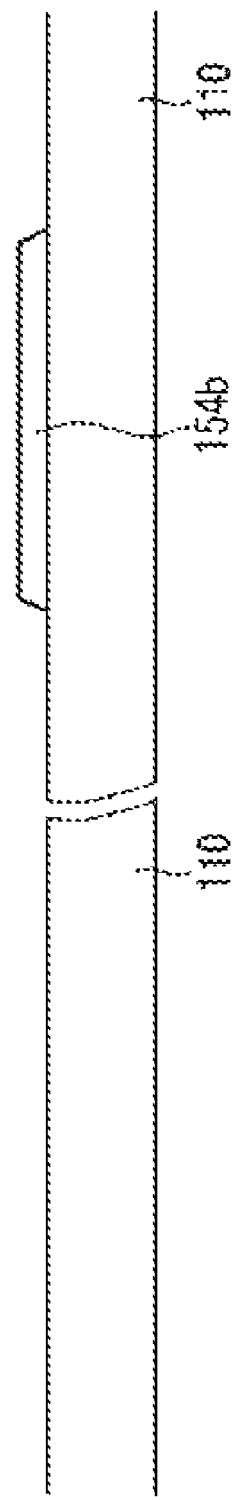
FIG. 4 to FIG. 9 are sectional views of the display device shown in FIG. 3 in intermediate steps of a manufacturing method thereof according to an embodiment of the present invention.

The crystallized silicon layer is patterned by photolithography and etching to form circuit semiconductors 154b as shown in FIG. 4.

Figure 5:
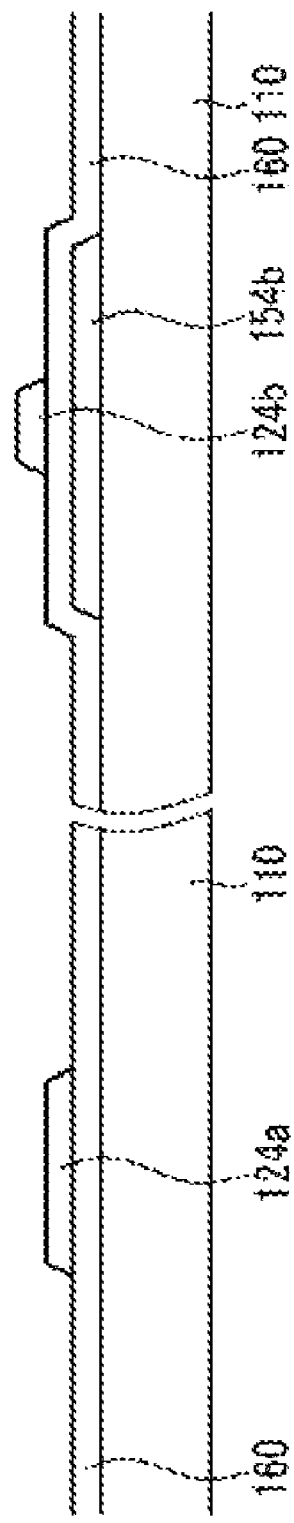

Referring now to FIG. 5, a lower gate insulating layer 160 is deposited on the entire surface of the substrate including the circuit semiconductors 154b. Next, a metal layer is deposited on the lower gate insulating layer 160, and the metal layer is patterned by photolithography and etching to form gate lines (not shown) including the display control electrodes 124a, and the circuit control electrodes 124b on the lower gate insulating layer 160, as shown in FIG. 5.

Figure 6:
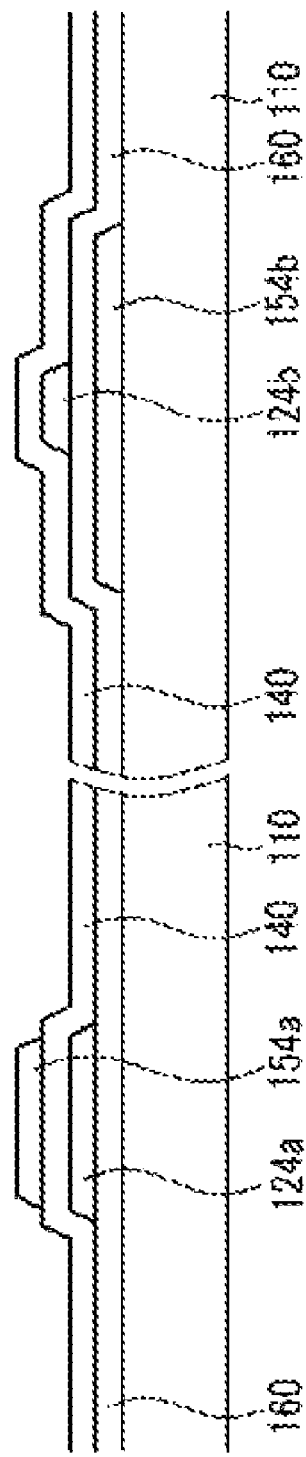

An upper gate insulating layer 140 and an intrinsic amorphous silicon layer are sequentially deposited on the display control electrodes 124a, the circuit control electrodes 124b, and the lower gate insulating layer 160, and then the intrinsic amorphous silicon layer is patterned by photolithography and etching to form display semiconductors 154a, as shown in FIG. 6.

Figure 7:
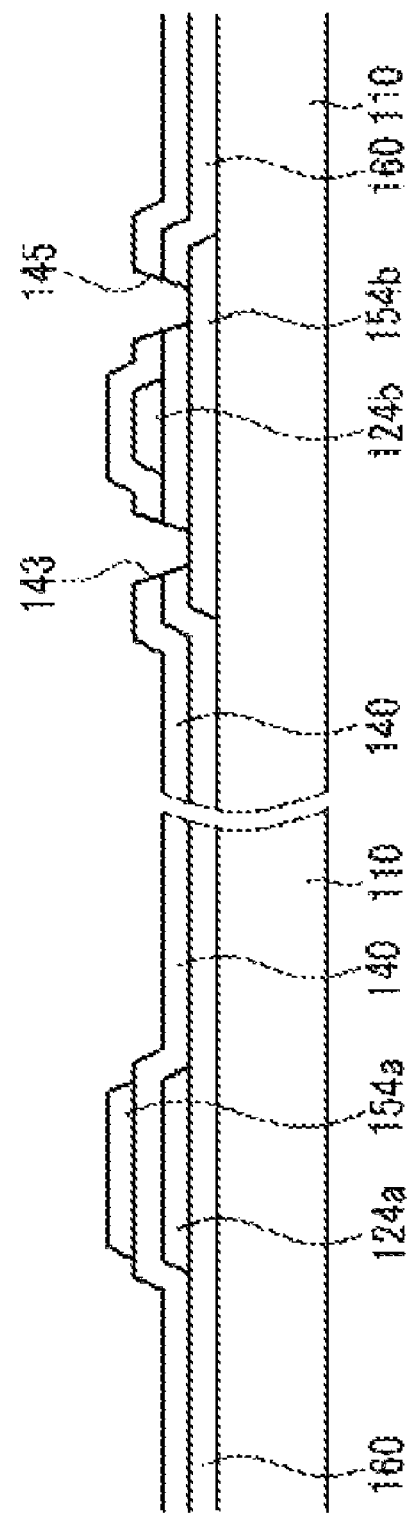

The upper gate insulating layer 140 and the lower gate insulating layer 160 are patterned by photolithography and etching to form a plurality of contact holes 143 and 145 exposing both sides of the circuit semiconductors 154b, as shown in FIG. 7.

Figure 8:
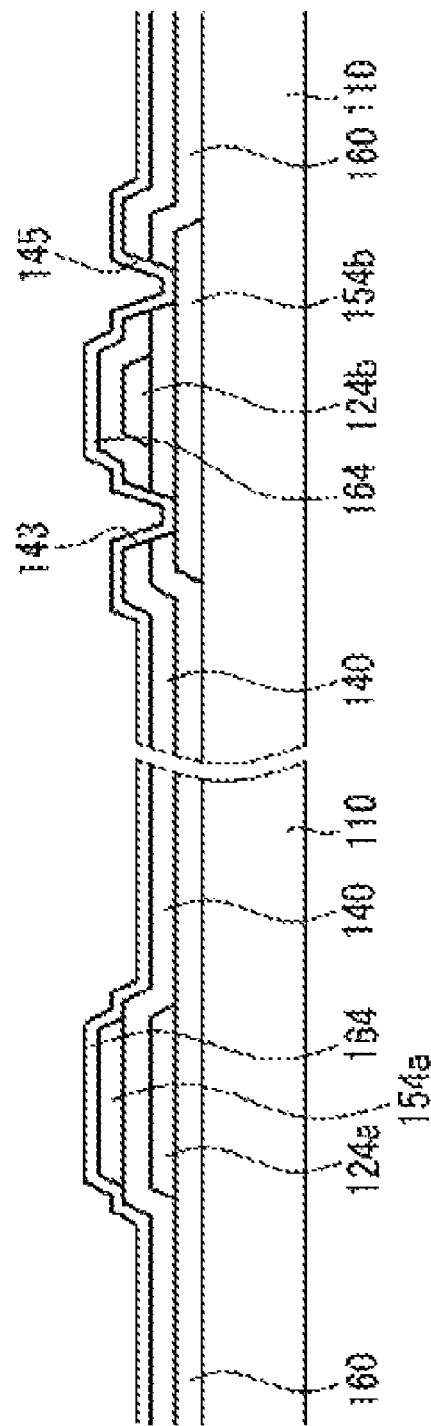

Referring to FIG. 8, an extrinsic amorphous silicon layer 164 is deposited on the entire surface of the substrate including the semiconductors 154a.

Figure 9:
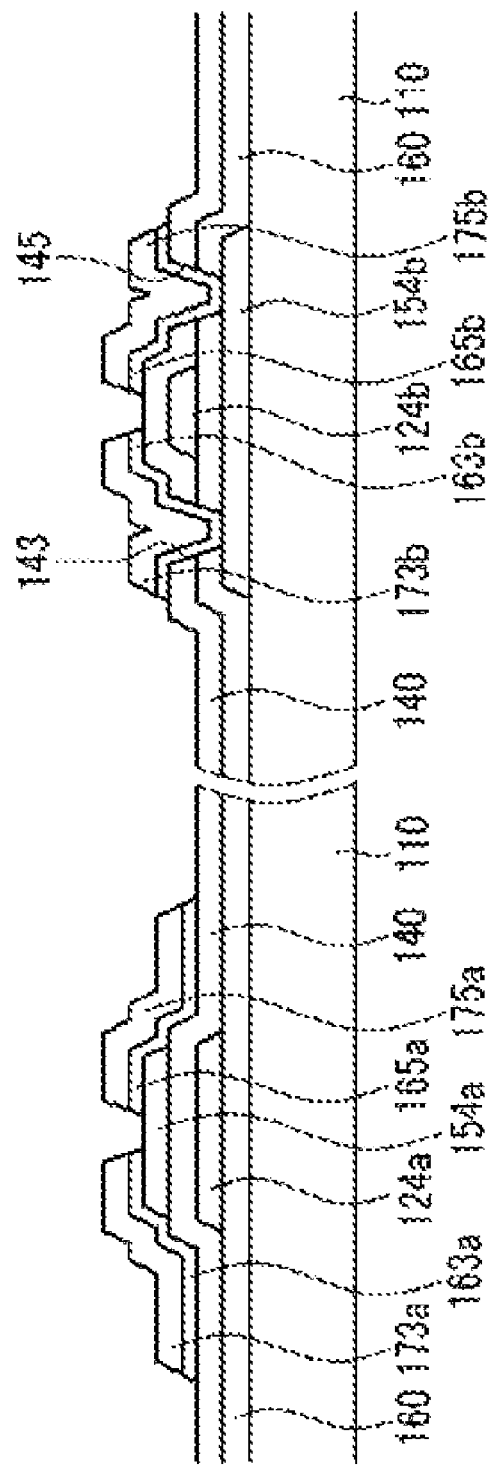

A metal layer is deposited on the extrinsic amorphous silicon layer 164, and then the metal layer is patterned to form data lines (not shown) including display input electrodes 173a, display output electrodes 175a facing the display input electrodes 173a, circuit input electrodes 173b, and circuit output electrodes 175b, as shown in FIG. 9.

Thereafter, as shown in FIG. 9, the extrinsic amorphous silicon layer 164 is dry-etched using the data lines, the display output electrodes 175a, the circuit input electrodes 173b, and the circuit output electrodes 175b as masks to form ohmic contacts 163a, 165a, 163b, and 165b.

Finally, a passivation layer 180 is deposited on the data lines including display input electrodes 173a, the display output electrodes 175a, the circuit input electrodes 173b, the circuit output electrodes 175b, and the upper gate insulating layer 140, and is patterned by photolithography (and etching) to form a plurality of contact holes 185, and a plurality of pixel electrodes 191 are formed thereon as shown in FIG. 3.

A display device according to another embodiment of the present invention will be described in detail with reference to FIG. 10 to FIG. 18.

First, an organic light emitting device according to an embodiment of the present invention will be described in detail with reference to FIG. 10.

Figure 10:
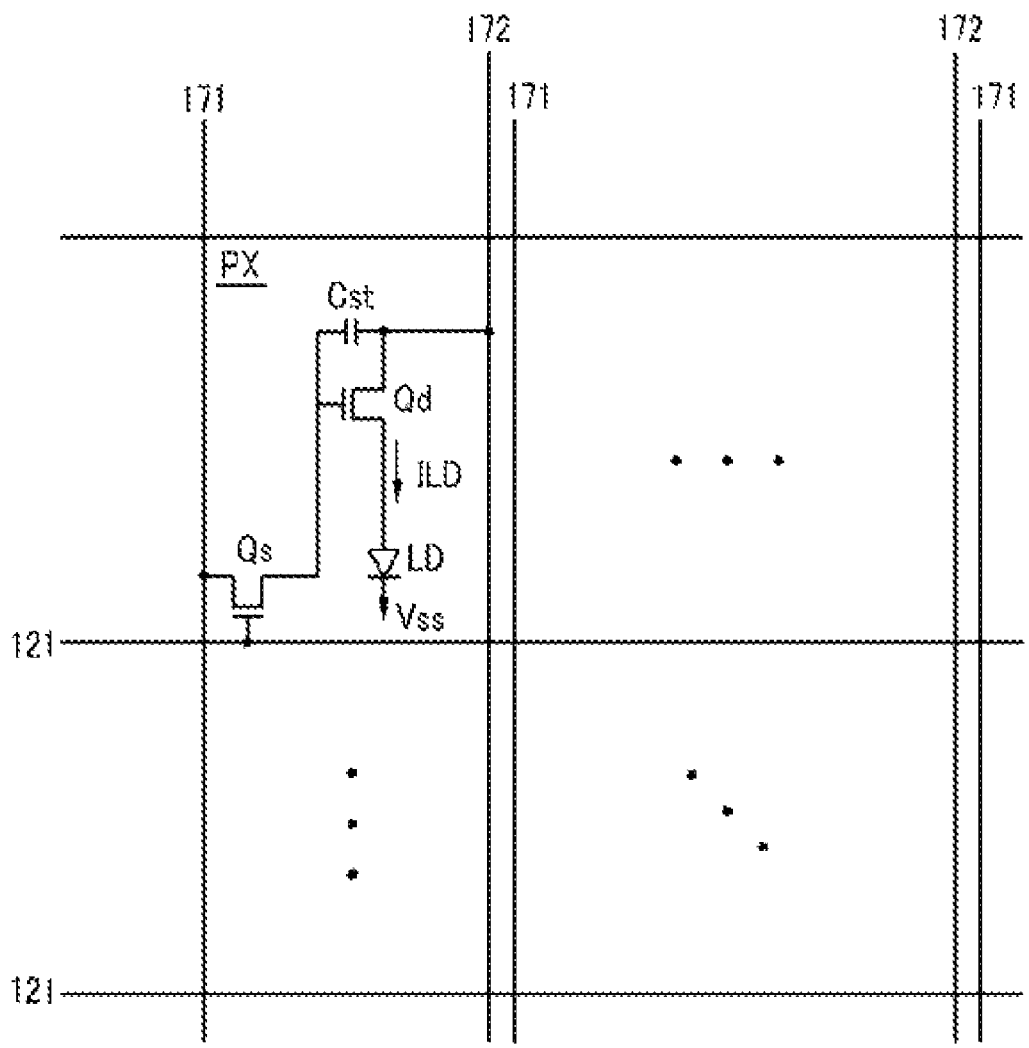
FIG. 10 is an equivalent circuit diagram of an organic light emitting device according to an embodiment of the present invention.

FIG. 10 is an equivalent circuit diagram according to an embodiment of the present invention.

Referring to FIG. 10, an organic light emitting device according to the present embodiment includes a plurality of signal lines 121, 171, and 172, and a plurality of pixels PX connected thereto and arranged substantially in a matrix.

The signal lines include a plurality of gate lines 121 transmitting gate signals (referred to as "scanning signals"), a plurality of data lines 171 transmitting data signals, and a plurality of driving voltage lines 172 transmitting driving voltages. The gate lines 121 extend substantially in a row direction and substantially parallel to each other, while the data lines 171 and the driving voltage lines 172 extend substantially in a column direction and substantially parallel to each other.

Each pixel PX includes a switching transistor Qs, a driving transistor Qd, a storage capacitor Cst, and an organic light emitting diode LD.

Each switching transistor Qs has a control terminal, an input terminal and an output terminal. The control terminal is connected with the gate line 121, the input terminal is connected with the data line 171, and the output terminal is connected with the driving transistor Qd. The switching transistor Qs transmits the data signals applied to the data line to the driving transistor Qd in response to the gate signals applied to the gate line 121.

Each driving transistor Qd also has a control terminal an input terminals and an output terminal. The control terminal is connected with the switching transistor Qs, the input terminal is connected with the driving voltage line 172, and the output terminal is connected to the organic light emitting diode LD. The driving transistor Qd drives an output current $I_{LD}$ having a magnitude depending on the voltage between the control terminal and the output terminal thereof.

The capacitor Cst is connected between the control terminal and the input terminal of the driving transistor Qd. The capacitor Cst stores the data signals applied to the control terminal of the driving transistor Qd and maintains the data signals after the switching transistor Qs turns off. The organic light emitting diode LD has an anode connected to the output terminal of the driving transistor Qd and a cathode connected to a common voltage Vss. The organic light emitting diode LD emits tight having an intensity depending on an output current $I_{LD}$ of the driving transistor Qd, thereby displaying images.

The switching transistor Qs and the driving transistors Qd are n-channel field effect transistors (FETs). However, at least one of the switching transistor Qs and the driving transistor Qd may be a p-channel electric field effect transistor. In addition, the connections among the transistors Qs and Qd, the capacitor Cst, and the organic light emitting diode LD may be modified.

A detailed structure of the organic light emitting device shown in FIG. 10 according to an embodiment of the present invention will be described in detail with reference to FIG. 11 along with FIG. 10.

Figure 11:
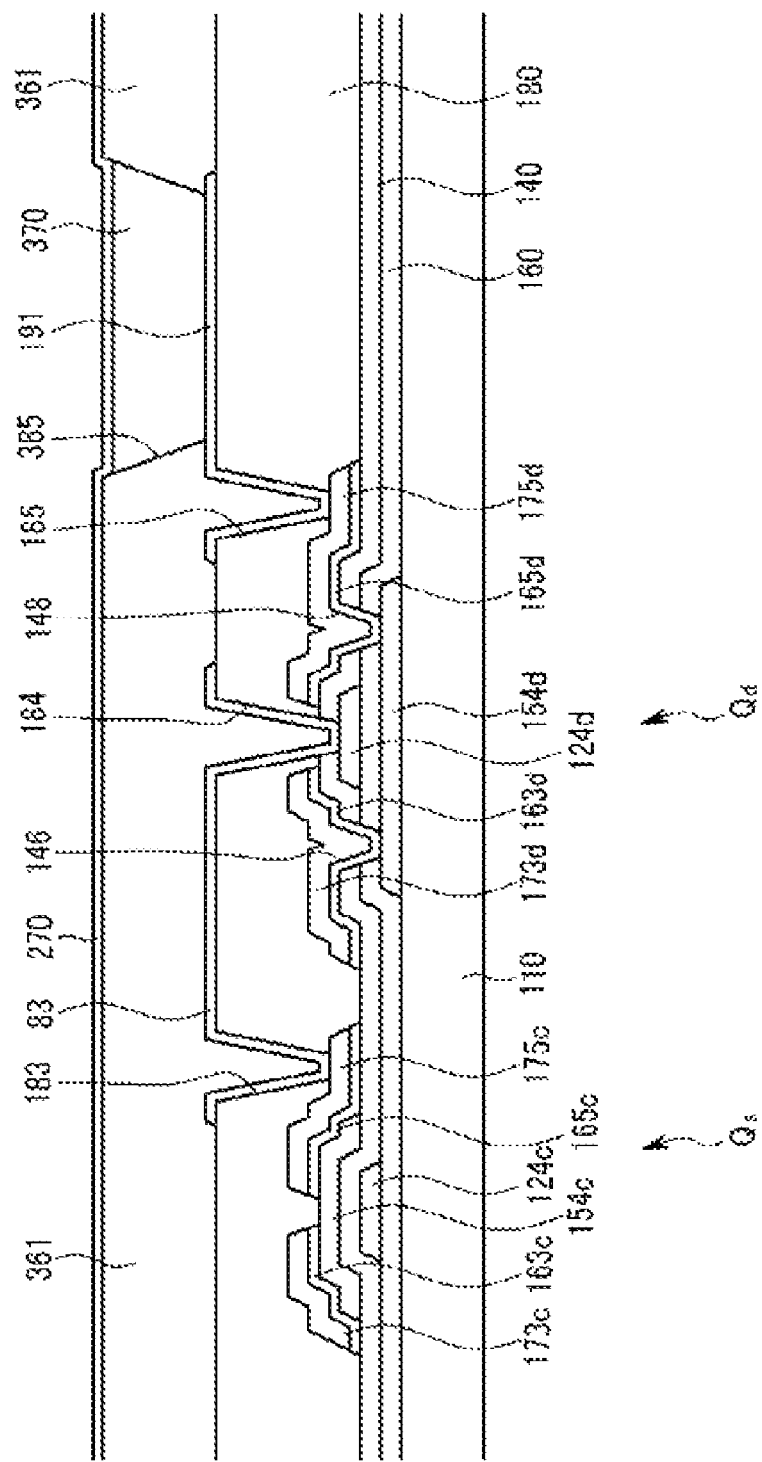
FIG. 11 is a sectional view of an organic light emitting diode display according to an embodiment of the present invention.

FIG. 11 is a sectional view of an organic light emitting device according to an embodiment of the present invention.

A buffer layer (not shown) made of silicon oxide or silicon nitride is formed on an insulating substrate 110 made of a transparent glass or plastic. A driving semiconductor 154d made of a microcrystalline or polycrystalline semiconductor is formed on the buffer layer. A tower gate insulating layer 160 is formed on the driving semiconductor 154d.

A gate line including a switching control electrode 124c and a driving control electrode 124d are formed on the lower gate insulating layer 160.

An upper gate insulating layer 140 is formed on the switching control electrode 124c, the driving control electrode 124d, and the lower gate insulating layer 160.

The lower gate insulating layer 160 and the upper gate insulating layer 140 have a plurality of contact holes 146 and 148 exposing portions of the driving semiconductor 154d.

A switching semiconductor 154c made of hydrogenated amorphous silicon is formed on the upper gate insulating layer 140. The switching semiconductor 154c overlaps the switching control electrode 124c.

A data line (not shown) including a switching input electrode 173c, a switching output electrode 175c, a driving voltage line (not shown) including a driving input electrode 173d, and a driving output electrode 175d are formed on the upper gate insulating layer 140 and the switching semiconductor 154c.

The switching input electrode 173c and the switching output electrode 175c partially overlap the switching control electrode 124c, and they are located opposite each other with respect to the switching semiconductor 154c.

The driving input electrode 173d and the driving output electrode 175d partially overlap the driving control electrode 124d, and they are connected to the semiconductor 154d through the contact holes 146 and 148.

Ohmic contacts 163c, 165c, 163d, and 165d made of amorphous silicon doped with impurities are formed under the switching input electrode 173c, the switching output electrode 175c, the driving input electrode 173d, and the driving output electrode 175d. The ohmic contacts 163c, 165c, 163d, and 165d have substantially the same planar shape as the data line, the switching output electrode 175c, the driving voltage line, and the driving output electrode 175d, respectively.

A passivation layer 180 is formed on the switching input electrode 173c, the switching output electrode 175c, the driving input electrode 173d, and the driving output electrode 175d.

The passivation layer 180 has a plurality of contact holes 183, 184, and 185 exposing portions of the switching output electrode 175c, the driving control electrode 124d, and the driving output electrode 175d, respectively.

A pixel electrode 191 and connecting member 83 are formed on the passivation layer 180.

The pixel electrode 191 is electrically connected to the driving output electrode 175d.

The connecting member 83 is connected to the switching output electrode 173c and the driving control electrode 124d through the contact holes 183 and 184, respectively.

The pixel electrode 191 and the connecting member 83 may be made of a transparent conductor such as ITO or IZO, or they may be made of an opaque conductor such as Al or an alloy thereof, or Au, Pt, Ni, Cu, or W having a large work function or an alloy thereof in a top emission type of display.

A plurality of partitions 361 are formed on the pixel electrode 191 and connecting member 83. Each partition 361 surrounds each pixel electrode 191 like a bank to define an opening 365. The partitions 361 may be made of an organic insulator, such as acrylic resin and polyimide resin, having heat-resistant and dissolvent properties, or an inorganic insulator, such as silicon dioxide ($SiO_2$) and titanium dioxide ($TiO_2$), and may have a multi-layered structure. The partition 361 may be made of a photosensitive material containing a black pigment so that the black partition 361 may serve as a tight blocking member and the formation of the partition 361 may be simplified.

An emitting member 370 is formed on the pixel electrode 191 and confined in the opening 365 defined by the partition 361.

Each tight emitting member 370 may have a multi-layered structure including an emitting layer (not shown) for emitting light and auxiliary layers (not shown) for improving the efficiency of light emission of the emitting layer.

Each light emitting member 370 may be made of a high molecular weight substance and a low molecular weight substance, which uniquely emits one of primary color lights such as red, green, and blue light, or a mixture thereof. For example, the high molecular substance may include a polyfluorene derivative, a (poly)paraphenylenevinylene derivative, a polyphenylene derivative, a polyfluorene derivative, polyvinylcarbazole, a polythiophene derivative, etc. Also, the low molecular weight substance may include anthracene such as 9,10-diphenylanthracene, butadiene such as tetraphenylbutadiene, tetracene, a distyrylarylene derivative, a benzazole derivative, and a carbazole derivative, etc. Additionally a dopant such as xanthene, perylene, cumarine, rhodamine, rubrene, a dicyanomethylenepyran compound, a thiopyran compound, a (thia)pyrilium compound, a periflanthene derivative, an indenoperylene derivative, a carbostyryl compound, Nile red, quinacridone, etc, may be doped to the low and high molecular weight compounds as a host material to increase the emitting efficiency.

The organic light emitting devices images by spatially adding the monochromatic primary color light emitted from the light emitting members 370.

The auxiliary layers may include an electron transport layer (not shown) and a hole transport layer (not shown) for improving the balance of electrons and holes and an electron injecting layer (not shown) and a hole injecting layer (not shown) for improving the injection of the electrons and holes. The hole transport layer and the hole injecting layer may be made of a material having a work function that lies between that of the pixel electrode 191 and that of the emission layer, and the electron transport layer and the electron injecting layer may be made of a material having a work function that lies between that of a common electrode 270 (described below) and that of the emission layer.

For example, the hole transport layer and the hole injecting layer may be made of a compound such as a diamine compound, MTDATA [4,4',4"-tris(3-menthylphenyl)phenylamino]triphenylamine, TPD (N,N'-diphenyl-N,N'-di(3-menthylphenyl)-1, 1-biphenyl-4, 4'-diamine), 1,1-bis(4-di-p-tolylaminophenyl)cyclohexane, N,N,N'N'-tetra(2-naphthyl)-4,4-diamino-p-terphenyl, 4,4',4-tris[(3-methylphenyl) phenylamino]triphenylamine, polypyrrole, polyaniline, and poly-(3,4-ethylenedioxythiophene):polystyrene sulfonate (PEDOT:PSS).

The light emitting member 370 uniquely emitting light of one of the primary colors, such as red, green, and blue, may be respectively arranged in each pixel, and the light emitting members 370 emitting light of three colors such as red, green, and blue may be all arranged in one pixel with vertical or horizontal deposition to form a white emitting layer below or above color filters emitting light of one of the primary colors such as red, green, and blue. Here, the color filters may be disposed under the emitting layer in a bottom emission type, and the color filters may be disposed on the emitting layer in a top emission type.

Furthermore, the luminance can be improved by further including the white pixel as welt as the red, green, and blue pixels with stripe or check arrangements.

A common electrode 270 is formed on the light emitting member 370 and the partition 361. The common electrode 270 is formed on the whole of the substrate 110, and supplies current to the light emitting member 370 in cooperation with the pixel electrode 191.

The switching control electrode 124c connected to the gate line, the switching input electrode 173c connected to the data line, and the switching output electrode 175c along with the switching semiconductor 154c form the switching thin film transistor Qs having a channel formed in the switching semiconductor 154c between the switching input electrode 173c and the switching output electrode 175c.

The driving control electrode 124d connected to the switching output electrode 175c, the driving input electrode 173d connected to the driving voltage line, and driving output electrode 175*d* connected to the pixel electrode 191 along with the driving semiconductor 154*d* form the driving thin film transistor Qd having a channel formed in the driving semiconductor 154*d* between the driving input electrode 173*d* and the driving output electrode 175*d*.

As described above, the switching semiconductor 154*c* is made of an amorphous semiconductor, white the driving semiconductor 154*d* is made of a microcrystalline or polycrystalline semiconductor, and therefore the channel of the switching thin film transistor is formed in the amorphous semiconductor, while the channel of the driving thin film transistor is made of a microcrystalline or polycrystalline semiconductor.

Accordingly, the switching thin film transistor Qs and the driving thin film transistor Qd of the display device according to this embodiment have channels made of the different materials from each other such that the desired characteristics for the switching thin film transistor and the driving thin film transistor may be satisfied.

The driving thin film transistor may include a channel of microcrystalline silicon or polycrystalline silicon such that the driving thin film transistor may have carrier mobility and stability. Accordingly, the current flowing in the driving thin film transistor may increase to enhance luminance of the organic light emitting device according to the embodiment of the present invention. Also, the so-called threshold voltage shift phenomenon caused by applying a constant positive voltage in driving of an organic light emitting device may be excluded such that the image sticking phenomenon is not generated and the life-time reduction of the organic light emitting device does not occur.

In addition, the channel of the switching thin film transistor Qs includes amorphous silicon having a low off-current. Accordingly the on/off characteristic of the switching thin film transistor Qs for controlling the data voltage, particularly reduction of the off-current, may be maintained such that the data voltage reduction due to a high off-current may be prevented and the cross-talk phenomenon of the organic light emitting device may be reduced. If the channel of the switching thin film transistor Qs includes microcrystalline silicon or polycrystalline silicon, then the off-current of the switching thin film transistor Qs may be high to cause the data voltage to reduce and the cross-talk phenomenon of the organic light emitting device to occur.

Although the organic light emitting device according to this embodiment includes a plurality of pixels having one switching thin film transistor Qs and one driving thin film transistor Qd other thin film transistors and wiring for driving them may be included to prevent the driving thin film transistor Qd from degrading and the lifetime of the organic light emitting device display from shortening.

A pixel electrode 191, a light emitting member 370 and the common electrode 270 form an organic light emitting diode LD having the pixel electrode 191 as an anode and the common electrode 270 as a cathode, or vice versa.

Now, a manufacturing method of the organic light emitting device shown in FIG. 11 is described with reference to FIG. 12 to FIG. 19 along with FIG. 11.

FIG. 12 to FIG. 19 are sectional views of the organic light emitting device shown in FIG. 11 in intermediate steps of a manufacturing method thereof according to an embodiment of the present invention.

Firstly, a buffer layer (not shown) and an amorphous silicon layer are sequentially deposited onto the substrate 110, and the amorphous silicon layer is crystallized. Here, the crystallization may be performed by solid phase crystallization (SPC), excimer laser annealing (ELA), metal induced lateral crystallization (MILC), etc.

Figure 12:
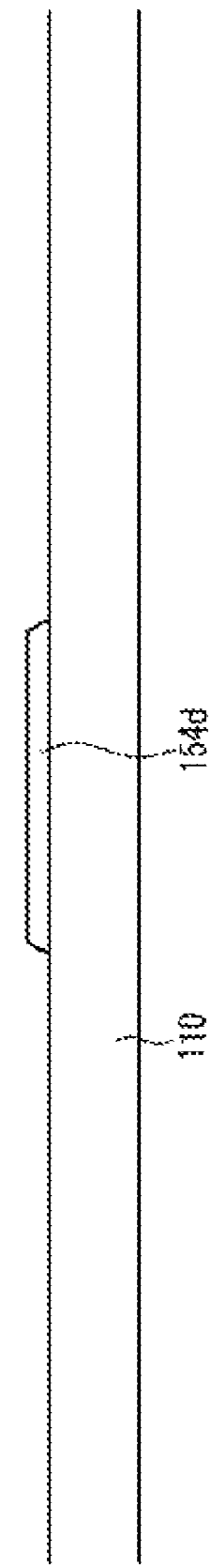
FIG. 12 to FIG. 19 are sectional views the organic light emitting device shown in FIG. 11 in intermediate steps of a manufacturing method thereof according to an embodiment of the present invention.

The crystallized silicon layer is patterned by photolithography and etching to form driving semiconductors 154*d* as shown in FIG. 12.

Figure 13:
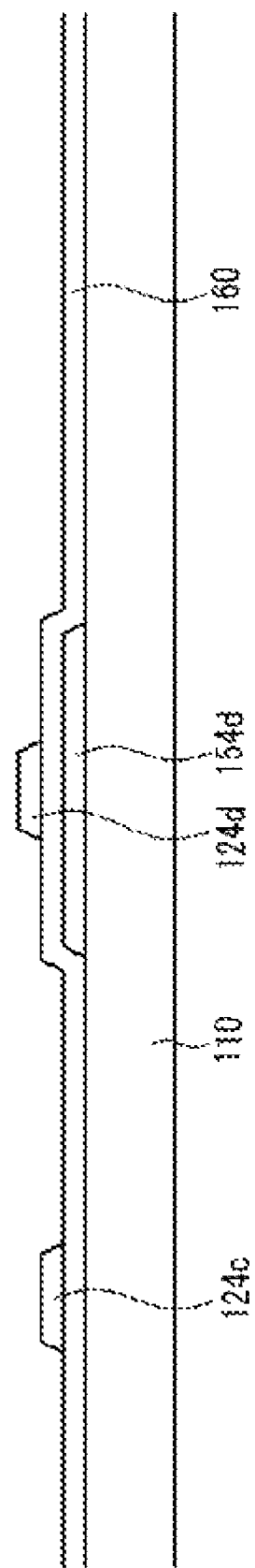

A lower gate insulating layer 160 is deposited on the entire surface of the substrate including the driving semiconductors 154*d* as shown in FIG. 13.

Next, a metal layer is deposited on the lower gate insulating layer 160, and then the metal layer is patterned by photolithography and etching to form gate lines (not shown) including the switching control electrodes 124*c* and the driving control electrodes 124*d*.

Figure 14:
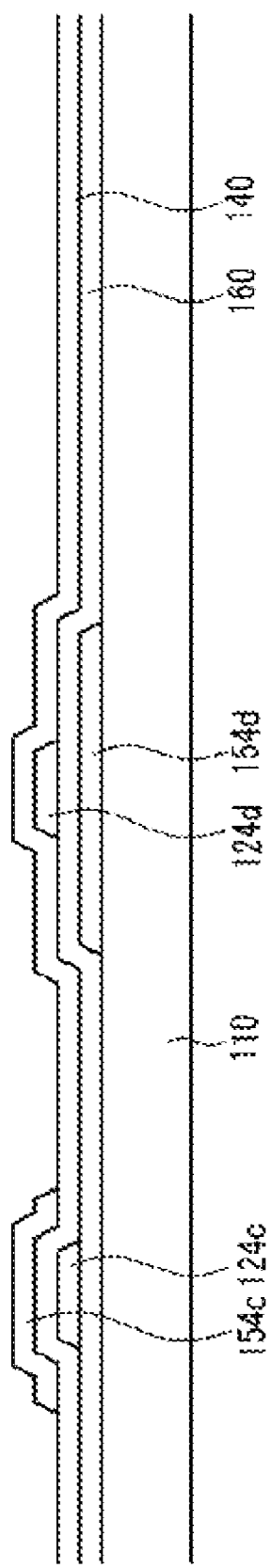

An upper gate insulating layer 140 and an intrinsic amorphous silicon layer are sequentially deposited on the switching control electrodes 124*c* and the driving control electrodes 124*d*, and then the intrinsic amorphous silicon layer is patterned by photolithography and etching to form the switching semiconductor 154*c* as shown in FIG. 14.

Figure 15:
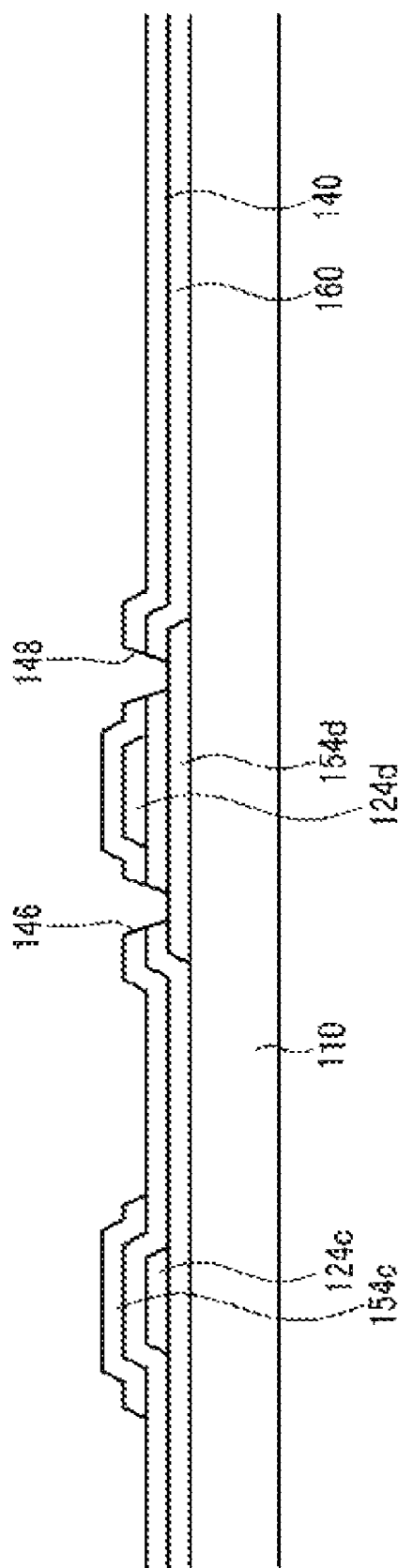

Next, the upper gate insulating layer 140 and the lower gate insulating layer 160 are patterned by photolithography and etching to form a plurality of contact holes 146 and 148 exposing both sides of the driving semiconductors 154*d*, respectively, as shown in FIG. 15.

Figure 16:
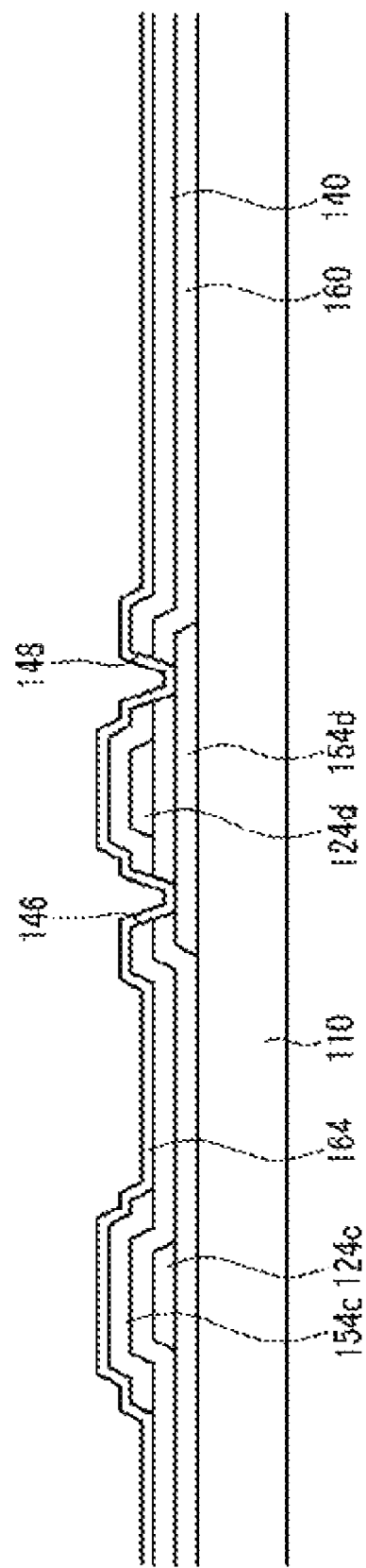

Referring to FIG. 16, an extrinsic amorphous silicon layer 164 is deposited on the entire surface of the substrate including the switching semiconductors 154*c*.

Figure 17:
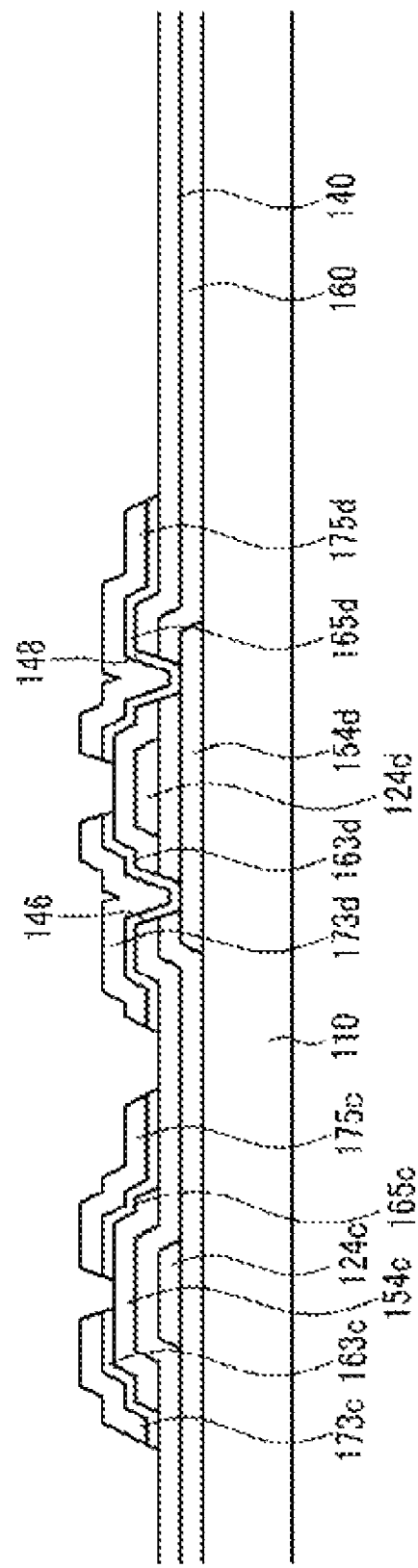

Referring to FIG. 17, a metal layer is deposited on the extrinsic amorphous silicon layer 164, and then the metal layer is patterned to form data lines (not shown) including switching input electrodes 173*c*, switching output electrodes 175*c* facing the switching input electrodes 173*c*, driving voltage lines (not shown) including driving input electrodes 173*d*, and driving output electrodes 175*d*.

Thereafter, the extrinsic amorphous silicon layer 164 is dry-etched using the data lines, the switching output electrodes 175*c*, the driving voltage lines, and the driving output electrodes 175*d* as masks to form ohmic contacts 163*c*, 165*c*, 163*d*, and 165*d*.

Figure 18:
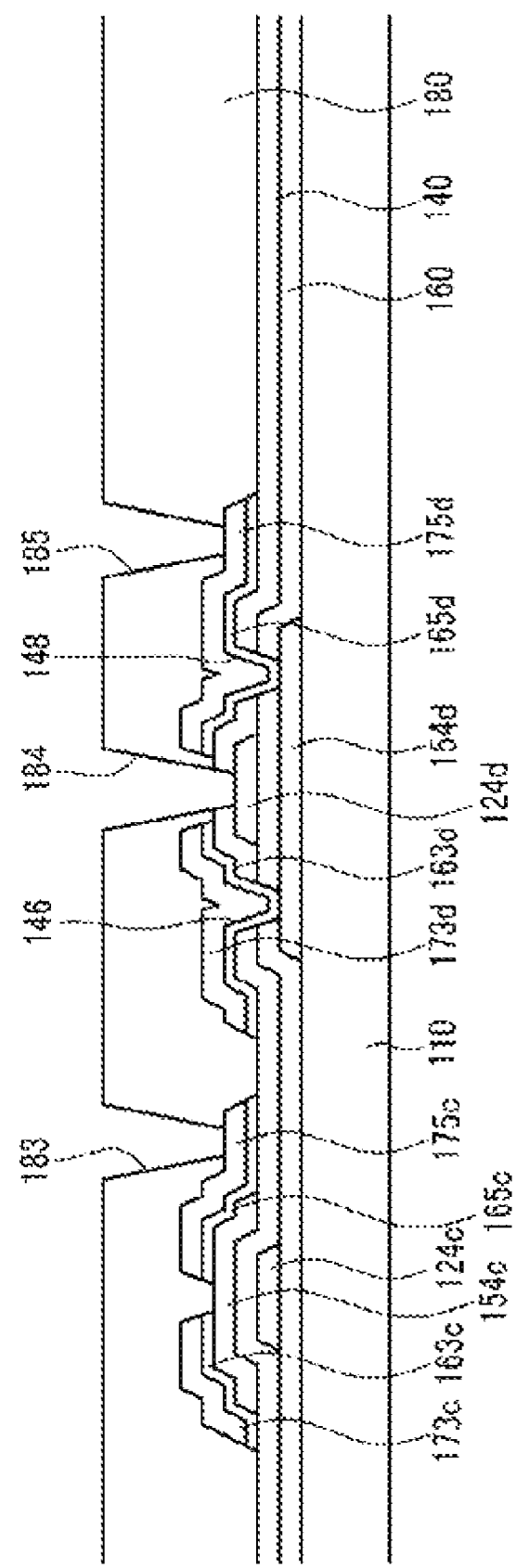

A passivation layer 180 is deposited on the data lines including switching input electrodes 173*c*, the switching output electrodes 175*c*, the driving input electrodes 173*d* the driving output electrodes 175*d*, and the upper gate insulating layer 140, and is patterned by photolithography (and etching) to form a plurality of contact holes 183, 184, and 185 as shown in FIG. 18.

Figure 19:
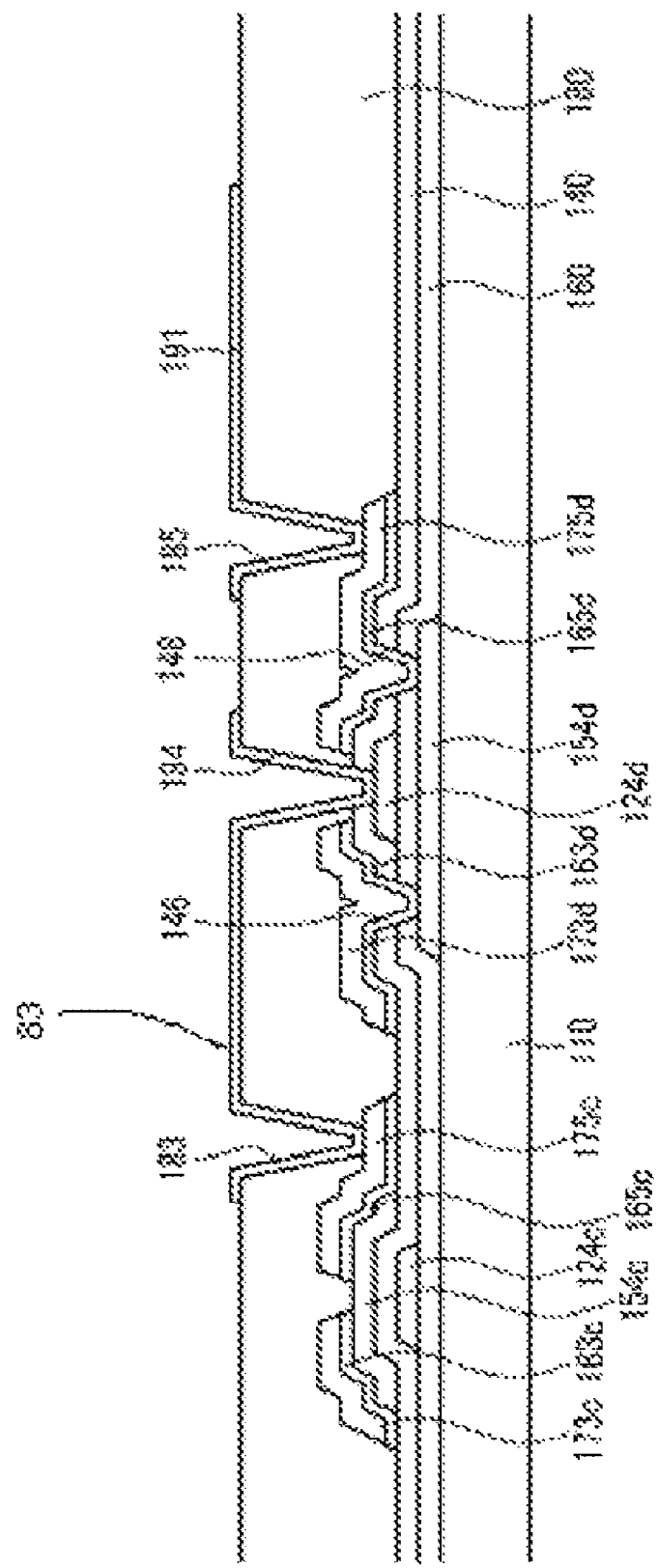

Next, a transparent conductive layer is deposited on the passivation layer 180 and patterned by photolithography and etching to form a plurality of pixel electrodes 191 and a plurality of connecting members 83 as shown in FIG. 19.

Referring to FIG. 11, a photosensitive organic insulator is deposited on the pixel electrodes 191, the connecting members 83, and the passivation layer 180, and is exposed and developed to form a partition 361 having openings 365 partly exposing the pixel electrodes 191.

Thereafter, a plurality of organic light emitting members 370 including a hole transport layer (not shown) and an emission layer (not shown) are formed thereon. The organic light emitting members 370 may be formed by a solution process such as inkjet printing and evaporation. In the inkjet printing, a solution is dropped into the openings 365 while moving the inkjet head (not shown), and in this case, a drying step for removing the solvent follows.

Thereafter, a common electrode 270 is formed on the partition film 361 and the light emitting members 370.

As described above, the plurality of switching thin film transistors and driving thin film transistors of the display device according to embodiments of the present invention have channels made of different materials from each other such that the desired characteristics for switching thin film transistors and driving thin film transistors may be satisfied.

While this invention has been described in connection with exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device, comprising:
   an image display unit including a first thin film transistor; and
   a driving unit formed outside of the image display unit and including a second thin film transistor,
   wherein the first thin film transistor and the second thin film transistor include a first semiconductor and a second semiconductor respectively,
   wherein the first semiconductor includes an amorphous semiconductor and the second semiconductor includes a polycrystalline semiconductor, and
   wherein the first semiconductor is disposed over a control electrode of the first thin film transistor and the second semiconductor is disposed under a control electrode of the second thin film transistor.

2. The display device of claim 1, wherein the driving unit comprises:
   a gate driver connected to a first signal line; and
   a data driver connected to a second signal line intersecting the first signal line,
   wherein the first signal line and the second signal line are connected to the first thin film transistor.

3. The display device of claim 2, wherein the first thin film transistor comprises:
   a first input electrode connected to the first signal line;
   a gate insulating layer located between the first input electrode and the first semiconductor;
   a first input electrode formed on the first semiconductor and connected to the second signal line; and
   a first output electrode facing the first input electrode.

4. The display device of claim 2, wherein the second thin film transistor comprises:
   a second control electrode formed on the second semiconductor;
   a second input electrode and a second output electrode located on the second control electrode and connected to the second semiconductor, respectively.

5. The display device of claim 4, further comprising:
   a plurality of ohmic contacts located between the first semiconductor and the first input electrode, between the first semiconductor and the first output electrode, between the second semiconductor and the second input electrode, and between the second semiconductor and the second output electrode, respectively.

6. The display device of claim 5, wherein the ohmic contacts have substantially the same planar shapes as the first input electrode, the first output electrode, the second input electrode, and the second output electrode, respectively.

7. A display device, comprising:
   a substrate;
   first and second signal lines formed on the substrate;
   a switching thin film transistor connected to the first and second signal lines and including a first semiconductor;
   a driving thin film transistor connected to the switching thin film transistor and including a second semiconductor;
   a first electrode connected to the driving thin film transistor;
   a second electrode facing the first electrode; and
   a light emitting member formed between the first electrode and the second electrode,
   wherein the first semiconductor includes an amorphous semiconductor and the second semiconductor includes a polycrystalline semiconductor, and
   wherein the first semiconductor is disposed over a first control electrode of the switching thin film transistor and the second semiconductor is disposed under a second control electrode of the driving thin film transistor.

8. The display device of claim 7, wherein the first control electrode of the switching thin film transistor is connected to the first signal line, and
   wherein the switching thin film transistor further comprises:
   a first input electrode formed on the first semiconductor and connected to the second signal line; and
   a first output electrode facing the first input electrode.

9. The display device of claim 8, wherein the second control electrode of the driving thin film transistor is connected to the first output electrode, and
   wherein the driving thin film transistor further comprises:
   a second input electrode connected to the second semiconductor on the second control electrode; and
   a second output electrode facing the first input electrode and connected to the first electrode.

10. The display device of claim 9, further comprising:
    a plurality of ohmic contacts located between the first semiconductor and the first input electrode, between the first semiconductor and the first output electrode, between the second semiconductor and the second input electrode, and between the second semiconductor and the second output electrode, respectively.

11. The display device of claim 10, wherein the ohmic contacts have substantially the same planar shapes as the first input electrode, the first output electrode, the second input electrode, and the second output electrode, respectively.

12. A manufacturing method of a display device including a plurality of first thin film transistors and a plurality of second thin film transistors, comprising:
    forming a polycrystalline semiconductor on a substrate;
    forming a first insulating layer on the polycrystalline semiconductor;
    forming a gate line including a first control electrode of the first thin film transistor and a second control electrode located on the polycrystalline semiconductor by depositing a conductive layer on the first insulating layer and patterning the conductive layer by photolithography and etching;
    forming a second insulating layer on the gate line and the second control electrode;
    forming an amorphous semiconductor located over the first control electrode on the second insulating layer;
    forming first and second contact holes in the first and second insulating layers; and
    forming a data line including a first input electrode, a first output electrode facing the first input electrode, a second input electrode contacting the polycrystalline semiconductor through the first contact hole, and a second output electrode facing the second input electrode, by depositing a conductive layer on the second insulating layer and patterning the conductive layer by photolithography and etching, wherein the amorphous semiconductor is disposed over the first control electrode and the polycrystalline semiconductor is disposed under the second control electrode.

13. The method of claim 12, further comprising:
forming an ohmic contact layer after forming the first and second contact holes; and
etching the ohmic contact layer using the data line, the first output electrode, the second input electrode, and the second output electrode as a mask after forming the data line, the first output electrode, the second input electrode, and the second output electrode.

14. The method of claim 12, wherein the forming of the polycrystalline semiconductor is performed by solid phase crystallization.

15. The method of claim 12, wherein the first thin film transistors are located in a display area of the display device and the second thin film transistors are located in a driving area of the display device.

16. The method of claim 12, further comprising:
forming a pixel electrode connected to the second output electrode after forming the data line, the first output electrode, the second input electrode, and the second output electrode.

17. The method of claim 16, further comprising:
forming a third insulating layer having an opening on the pixel electrode;
forming a light emitting member in the opening; and
forming a common electrode on the light emitting member.

18. The method of claim 17, wherein a connecting member connecting the first output electrode and the second input electrode is formed in the step of forming the pixel electrode.

* * * * *